United States Patent [19]

Hegeler et al.

[11] 4,172,997

[45] Oct. 30, 1979

[54] DIGITAL TUNER FOR A COMMUNICATION RECEIVER, TYPICALLY AN AM RECEIVER

[75] Inventors: Wilhelm Hegeler; Wolfgang Busse, both of Hildesheim, Fed. Rep. of Germany

[73] Assignee: Blaupunkt-Werke GmbH, Hildesheim, Fed. Rep. of Germany

[21] Appl. No.: 860,185

[22] Filed: Dec. 13, 1977

[30] Foreign Application Priority Data

Dec. 13, 1976 [DE] Fed. Rep. of Germany ....... 2656332

[51] Int. Cl.² ............................................. H04B 1/06
[52] U.S. Cl. .................................... 325/464; 325/465; 331/1 A
[58] Field of Search ............... 325/453, 459, 464, 465, 325/468, 420; 331/1 A, 18

[56] References Cited

U.S. PATENT DOCUMENTS

| | | | |
|---|---|---|---|
| 3,405,369 | 10/1968 | Couvillon | 331/1 A |
| 3,651,422 | 3/1972 | Underhill | 331/1 A |
| 3,962,644 | 6/1976 | Baker | 325/465 |

OTHER PUBLICATIONS

Digital Methods Synthesize Frequency–Illingworth Electronic Design 11 May 1968, pp. 78–81.

*Primary Examiner*—Robert L. Richardson
*Assistant Examiner*—Joseph A. Orsino, Jr.
*Attorney, Agent, or Firm*—Frishauf, Holtz, Goodman & Woodward

[57] ABSTRACT

To provide a synthesized tuning frequency to control the local oscillator in a superheterodyne receiver, a frequency generating circuit includes a reference oscillator which provides a reference frequency which is frequency-divided to generate a plurality of divided sub-frequencies which, with respect to the reference frequency have at least a flank which is non-coincident with respect to corresponding flanks of other frequencies. These divided frequencies are added in an adder, the addition of which is controlled in accordance with a tuning command stored in a digital memory. Preferably, the adder is a NOR-gate to which selected frequencies are connected, selected by NAND-gates in accordance with a number provided by a digital tuning control and stored in the digital memory. The synthesized frequency is then used to provide an error control signal within a control loop connected to the local oscillator.

5 Claims, 3 Drawing Figures

DIGITAL TUNER FOR A COMMUNICATION RECEIVER, TYPICALLY AN AM RECEIVER

The present invention relates to a digital tuner for a communication receiver, and more particularly for FM or AM public service broadcast reception.

BACKGROUND AND PRIOR ART

Tuning devices for receivers in communication service use are used to tune the receiver to a certain frequency, the tuned-in station being usually indicated on a scale.

Digital tuners have been designed according to the principle of digitization of a tuning voltage. Such systems have very high requirements with respect to constancy of the reference voltage or of a digital-to-analog converter therein as well as the voltage-to-frequency converter, respectively.

It has also been proposed to use a frequency synthesizer.

A synthesizer is a circuit arrangement capable of providing a great number of discrete frequencies all of which are derived from a highly stable oscillator.

A phase-locked loop quartz digital tuner (see, for example, "Funkschau" 1976, number 20, pages 839-843) operating on the synthesizer principle has been published. In this tuner the frequency from the oscillator is fed via a programmable frequency divider to a stage serving as a frequency and phase locked loop (PLL), and compared in the PLL with a quartz-controlled reference frequency of 25 kc/s. A correction or error pulse sequence in form of a duty factor variation is developed during the aforementioned process; the average voltage with respect to time is developed in an integrator and supplied to both the oscillator disposed in the receiving section and the r-f stage so as to serve as the tuning voltage.

This known arrangement has some important disadvantages. The frequency of the tuner is not continuously variable. The selectable nominal incoming frequencies are to be found in a frequency pattern of 100 kc/s. The tuning pattern is too coarse to be used to tune amplitude-modulated stations.

THE INVENTION

It is an object to develop a digital tuner for a communication receiver avoiding the disadvantages of known arrangements and being usable for frequencies of all wavebands, i.e. a tuner being almost continuously variable.

Briefly, a synthesized nominal frequency is produced by generation and addition of sub-frequencies which are not coincident. Essentially, it comprises a frequency standard, a frequency synthesizer, and a working store so controlling the addition of the non-coincident sub-frequencies that the synthesized nominal frequency, $f_S$, varies proportional to the count in the working store.

The tuning device according to the present invention has the advantage that, owing to addition of non-coincident frequencies, the frequency pattern for the selectable nominal incoming frequencies can be chosen as fine as desired.

A further advantage of the present invention is that the relation between the correcting signal and the frequency error is such that a considerable deviation between nominal incoming frequency and actual incoming frequency is corrected very rapidly, e.g. according to an exponential relation.

Drawings, illustrating an example:

Figure 1:
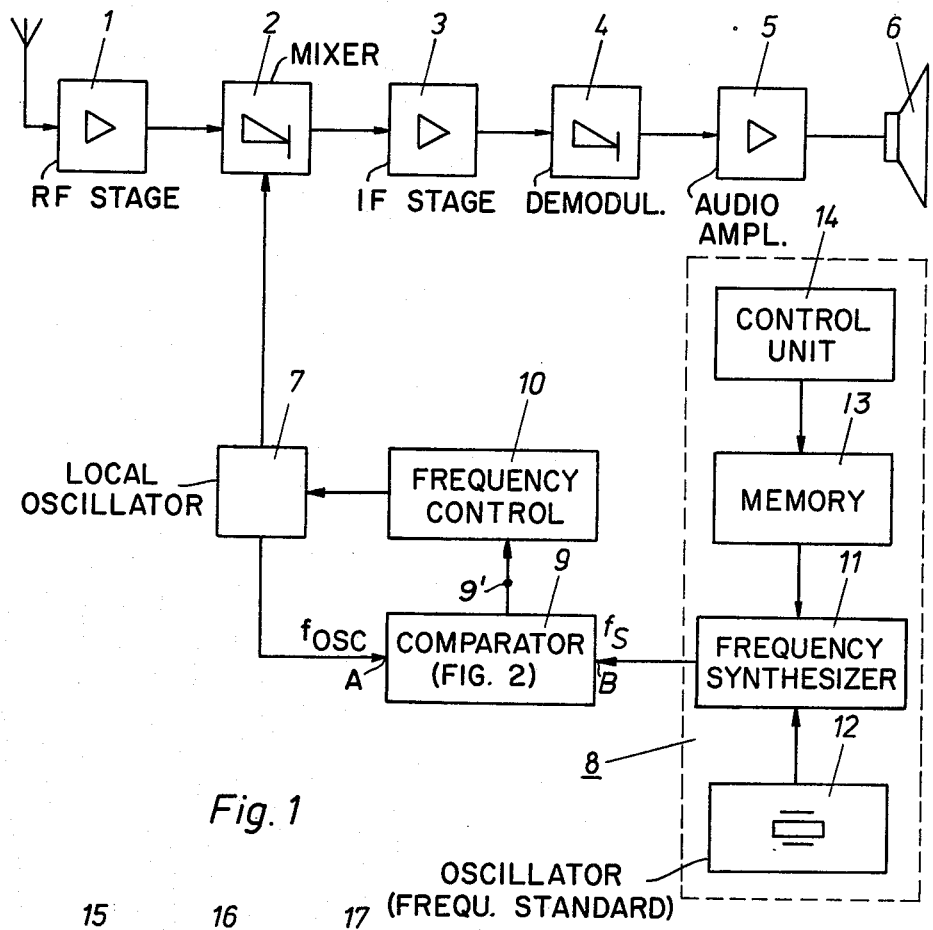
FIG. 1 is a block diagram of a receiver with a digital tuner.

FIG. 1 illustrates the essential components of a receiver: an r-f stage 1, a mixer 2, an i-f stage 3, a demodulator 4, and an a-f stage 5 with a loudspeaker 6, all connected in series.

A local oscillator 7 is, switchable from frequency modulation local oscillation frequency to amplitude modulation frequency. The local oscillator frequency is located in a control loop of a digital tuner. The digital tuning device essentially consists of a stage 8 for producing a synthesized nominal frequency $f_S$, a comparator 9, and a frequency control 10. Stage 8 for producing a synthesized nominal frequency $f_S$ is substantially constituted by a frequency synthesizer 11 with a quartz oscillator 12 serving as a frequency standard. This frequency synthsizer 11 is controlled by a working memory 13 to which a station selection control unit 14 is assigned for input of data. Unit 14 may include station selector push buttons, a tuning dial, and the like, and wave length, ranges, or frequency band switches.

Figure 2:
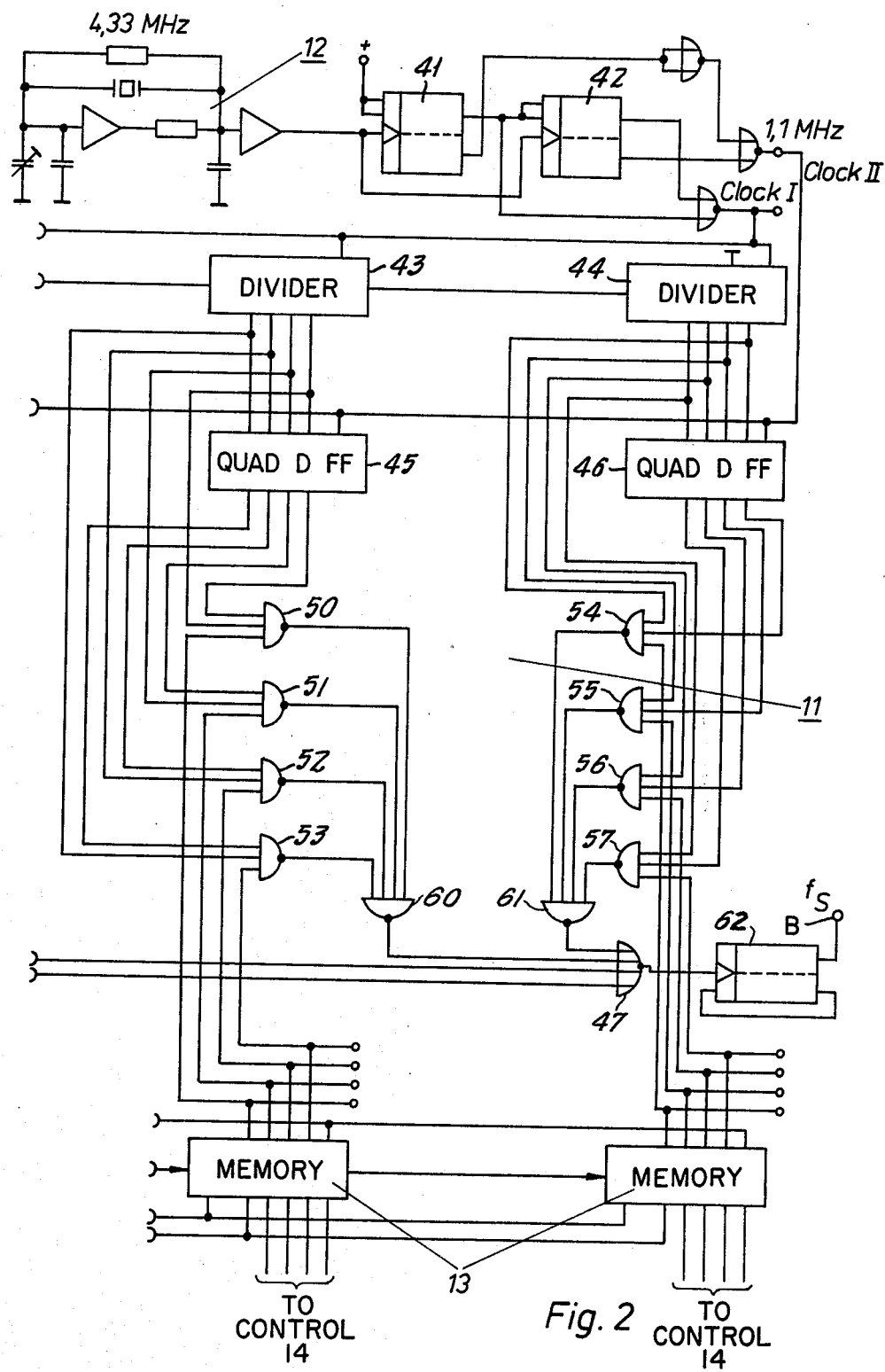
FIG. 2 is part of a stage for producing a synthesized nominal frequency.

The individual units of the digital tuner and operation: (see FIG. 2). The quartz oscillator 12 serves as a frequency standard; it is located in the stage 8 for producing a synthesized nominal frequency $f_S$. In the present embodiment, it is a quartz oscillator with a frequency of $f_Q = 4.433$ MHz. The frequency synthesizer produces, based on the stabilized reference frequency $f_Q$, first two clock pulse sequences clock I and clock II wave shaped by flip-flops (FF) 41, 42, with the frequency $f_Q/4$ and the pulse duty factor 1:4 by frequency division and logic connection. These clock pulse sequences I and II are 180° phase-displaced. The rectangular sub-frequencies $f_Q \cdot 2^{-3}$ to $f_Q \cdot 2^{-18}$ are produced by continuous frequency division from the clock pulse sequence in dividers 43, 44 and two other dividers of the same type connected in series to the dividers 43, 44 and not shown in FIG. 2. One of the flanks or edges of these signals are non-coincident. The non-coincident waves or pulses of the sub-frequencies are added in two NAND-gates 60, 61 and two other NAND-gates of the same type, not shown in FIG. 2. The outputs of these NAND-gates are connected to inputs of a NOR-gate 47. The circuit containing these four NAND-gates and the NOR-gate 47 represents a single 16-input-AND-gate. At the output of the NOR-gate 47 non-coincident negative pulses are available. These are obtained from the above-mentioned edges of the signals as follows:

Each of the rectangular sub-frequencies is delayed by a half clock cycle $2/f_Q$ and inverted in a D-flip-flop (FF) of Quad-D-flip-flops 45, 46 and two other Quad-D-flip-flops of the same type, not shown in FIG. 2; the clock rate of the D-FF corresponds to clock II. A logical NAND-combination of input and output of a D-flip-flop 45, 46, respectively, in NAND-gates 50-57 and in eight other NAND-gates not shown in FIG. 2 then produces a pulse sequence with the corresponding frequency and the pulse duration $2/f_Q$. The pulses of all frequencies will occur at different times by suitable choice of the code, or logic in a frequency divider chain. As a result, non-coincident sub-frequency series are obtained at NOR-gate 47.

No pulses are lost by coincidence in the course of the subsequent addition of these frequencies or pulses, respectively, in NOR-gate 47. Consequently, the resultant frequency exactly corresponds to the sum of the utilized sub-frequencies transmitted through the four NAND-gates 50–53, or 54–57 connected to the NOR-gate 47 and the NOR-gate 47 itself.

The system uses a 16-bit frequency divider chain in the frequency synthesizer 11 and in the working memory 13. For clarity, FIG. 2 only shows an eight-bit memory rather than the sixteen bits actually utilized in the present embodiment.

The NAND-gates 50–57 utilized for the above-mentioned AND-operation are provided with a further trigger, or control input connected each to one of sixteen outputs of the working memory 13. The individual sub-frequencies can be switched on and off in the frequency synthesizer 11 by means of these trigger or control inputs under control of control unit 14 (FIG. 1).

The output is wave shaped in FF 62 and available at terminal B as the signal $f_S$.

Figure 3:
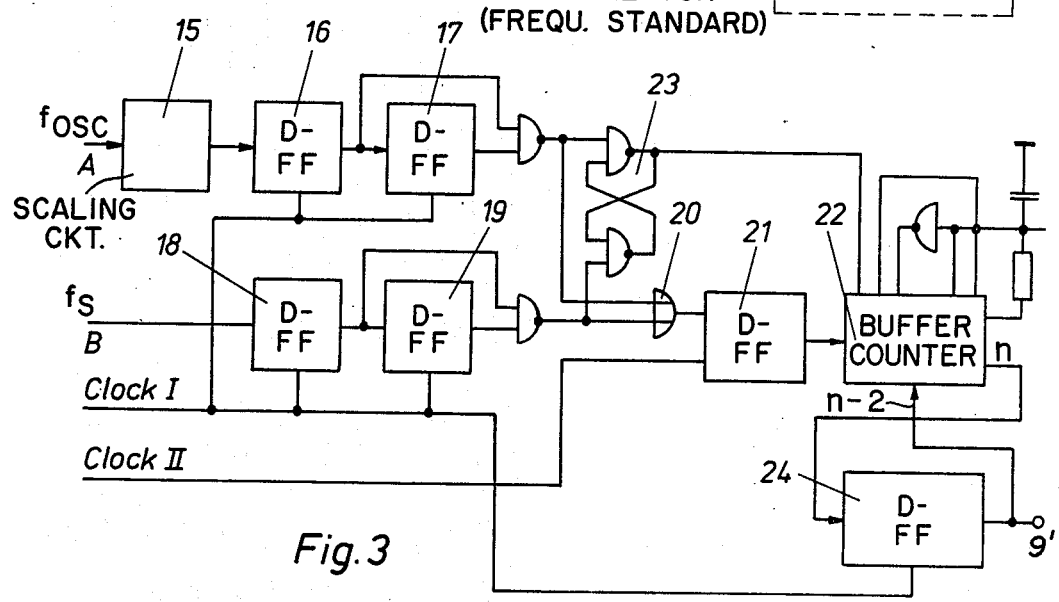
FIG. 3 is a block diagram of a comparator.

The comparator 9 (FIG. 3) has two inputs A, B, the input A being connected to the frequency $f_{OSC}$ from oscillator 7 in the receiving section and the input B to the output frequency $f_S$ of the frequency synthesizer 11. The input A is coupled to a scaling circuit 15 which is part of the comparator 9. D-FFs 16, 17 are serially connected to scaling circuit 15. The input B is directly connected to a D-FF 18 with a subsequent further D-FF 19. The D-FFs 16, 17, 18, 19 are clocked with the clock frequency of clock I.

The comparator 9 also includes an EXCLUSIVE-OR-gate 20 with a further subsequent D-FF 21 connected thereto, clocked with the frequency clock II. The D-FF 21 is connected to a buffer counter 22, the count direction input of which is coupled to a NAND-base-FF 23. Finally, a further D-FF 24 is connected to the buffer counter 22, the output of the D-FF 24 being the output 9' of the comparator 9 and being connected to the input of the frequency control 10. The frequency control 10 essentially consists of a conventional integrator.

Operation of the digital tuner: The working memory 13 is set to a desired number representative of a desired frequency by means of the control unit 14. In the present embodiment, a working memory 13 operates on the binary digital system and is designed for binary numbers d between 0 and $2^{16}$.

A binary number d which is present in the working memory 13 determines the synthesized command frequency $f_S$, produced by addition, and present at the output of the frequency synthesizer 11. The most significant bit of the working memory 13, which bit changes least during clocking, controls the highest sub-frequency, etc. The frequency obtained an addition is divided by two in the frequency synthesizer 11, so that the resultant synthesized frequency at the output of the frequency synthesizer 11 will have a pulse and interval duration of at least one clock cycle. The synthesized frequency is then $$f_S = (f_Q \cdot d / 2^{19}) \text{ wherein } 0 < f_S < 544 \text{ kHz}$$

There is a periodic relation between the synthesized command frequency $f_S$ and the lowest utilized sub-frequency. The deviation from a pulse sequence, the pulses of which have equal spacing of time, however, in each interval in question is no more than one pulse. The synthesized command frequency $f_S$ is supplied to the input B of the comparator 9.

The frequency of an AM oscillator (tuned to an AM waveband) serving as an oscillator 7 arranged in the AM receiving section, and the frequency of an FM oscillator (tuned to an FM waveband) and divided by twenty, respectively, is first divided by sixteen in the scaling circuit 15 of the comparator 9 and thereupon compared with the synthesized nominal frequency $f_S$.

For this purpose the pulse edges of both pulse trains $f_{OSC}$ and $f_S$ are synchronized to clock I by means of the D-FFs 16, 18. The D-FFS 17, 19 in connection with two NAND-gates supply pulse trains with a pulse duration of $4/f_Q$. By means of the exclusive OR-gate 20, a train of difference pulses is obtained from these pulse trains. Coincident pulses eliminate one another. Simultaneously the sign of the frequency difference is formed in the NAND-base-FF 23 which determines the counting direction of the subsequent buffer counter 22. Buffer counter 22 integrates short-time irregularities in the difference frequency which may occur as a result of failure or periodicity of the synthesized command frequency $f_S$ and the indefinite phase relationship between the two frequencies.

Upon overflow, the buffer counter 22 produces at output n, in the subsequent D-FF 24, a correction pulse and is thereupon set back by two counter steps by this pulse, which results in division by two of a difference frequency, with constant sign. In the vicinity of a correction pulse, the most significant bit of the buffer counter 22 is thus free from the rapid variations of the polarity of the difference frequency. The most significant bit is used to determine the polarity of the correction pulse.

A correction pulse train is generated, the polarity of which corresponds to the sign of the frequency error and the frequency of which is proportional to the frequency error. This correctional pulse train, or sequence is averaged over some periods of the frequency to be compared, so that phase errors and irregularities of the synthesized frequency $f_S$ become negligible.

The integration of the error is performed in the buffer counter 22. The correction pulses are fed to the frequency control 10 in order to develop the tuning voltage. The frequency of the pulses is proportional to the error frequency, and, consequently, the tuning voltage changes. The tuning voltage will approach the nominal value exponentially. Thus, a considerable frequency error is rapidly corrected. This is one of the substantial advantages of the present tuning and storing system.

In an actual embodiment, the dividers 43, 44 (FIG. 2) were: RCA CD 4029 AE

Memory 13 was RCA CD 4029 AE

Various changes and modifications may be made within the scope of the inventive concept.

We claim:
1. Digital tuner for a communication receiver having a local oscillator (7);
a circuit (8) to generate a synthesized command frequency ($f_S$);
a comparator (9) connected to and receiving the frequency ($f_{OSC}$) of the local oscillator and the synthesized command frequency ($f_S$) from the frequency generating circuit (8), and generating an error signal, said error signal being applied to the oscillator (7) to control the oscillator frequency as a function of command frequency in a closed control loop, wherein,
the frequency generating circuit (8) comprises
a reference oscillator (12) generating a reference frequency;
frequency divider means (43, 44) connected to the reference oscillator and generating a plurality of divided sub-frequencies;
phase shift means (clock II; 45, 46) connected to receive said sub-frequencies;
logic combining means (50-57) connected to receive the divided sub-frequencies from the frequency dividers and the phase shifted sub-frequencies from the phase shift means and logically combining said sub-frequencies to form combined sub-frequencies which have at least one like flank which is non-coincident with respect to other sub-frequencies of said plurality of divided sub-frequencies;
adder means (60, 61, 47) connected to the output of said logic combining means (50-57) and adding said combined sub-frequencies of non-coincident flanks;
a memory (13); and tuning selection means (14) connected to the memory and entering therein a value representative of a selected tuning frequency, the memory being connected to the logic combining circuit for controlling the adder means (47, 60, 61) in accordance with the value stored in the memory to generate, by selective addition of selected sub-frequencies, said synthesized command frequency ($f_S$).

2. Tuner according to claim 1, wherein the tuning selection means (14) provides a control number to the memory (13) representative of a selected frequency;
the memory is a digital memory (13);
and said logic combining means includes a plurality of coincidence gates (50-57) connected to respective outputs of said memory to selectively enable said coincidence gates and thus control the addition of said divided sub-frequencies and phase shifted sub-frequencies under control of the memory (13) as controlled, in turn, by said tuning selection means (14).

3. Tuner according to claim 1, wherein the comparator (9) includes a frequency difference generating stage (21, 23) generating a pulse train representative of the difference between the frequency of the local oscillator (7) and the synthesized command frequency ($f_S$),
and a bipolar buffer counter (22) having said pulse train applied thereto, the frequency of overflow of said buffer counter and the respective count direction of said buffer counter determining the polarity and amplitude of the error signal applied to said local oscillator.

4. Tuner according to claim 2, wherein said frequency generating circuit (8) includes means (41, 42) coupled to said reference oscillator (12) and providing clock pulses which are phase-shifted with respect to each other, said phase-shifted clock pulses being connected to control the phase shift means (45, 46) and thus the inputs to said coincidence gates (50-57) to provide for non-coincident occurrence of at least one of the corresponding respective flanks of the divided sub-frequencies.

5. Tuner according to claim 4, wherein the reference oscillator (12) includes means (41, 42) generating its output frequency in the form of pulses suitable for digital signal processing.

* * * * *